(12) United States Patent  
Burnham et al.

(10) Patent No.: US 8,173,331 B2  
(45) Date of Patent: May 8, 2012

(54) METHOD AND APPARATUS FOR SUB-PELLICLE DEFECT REDUCTION ON PHOTOMASKS

(75) Inventors: Jay S. Burnham, Essex Junction, VT (US); Frances A. Houle, Fremont, CA (US); Louis M. Kindt, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 166 days.

(21) Appl. No.: 12/685,491

(22) Filed: Jan. 11, 2010

(65) Prior Publication Data

US 2010/0178598 A1    Jul. 15, 2010

Related U.S. Application Data

(60) Provisional application No. 61/143,658, filed on Jan. 9, 2009.

(51) Int. Cl.
*G03F 1/00* (2012.01)

(52) U.S. Cl. .......................................................... 430/5

(58) Field of Classification Search ...... 430/5; 427/164, 427/165, 167
See application file for complete search history.

(56) References Cited

U.S. PATENT DOCUMENTS

| 5,700,603 | A   |   | 12/1997 | Lee |      |
|-----------|-----|---|---------|-----|------|
| 6,566,021 | B2  |   | 5/2003  | Wang |     |
| 6,841,309 | B1  | * | 1/2005  | Alpay et al. | 430/5 |
| 7,029,800 | B2  |   | 4/2006  | Su et al. |  |
| 7,078,134 | B2  |   | 7/2006  | Wurm et al. |  |
| 2005/0260504 | A1 | * | 11/2005 | Becker et al. | 430/5 |

OTHER PUBLICATIONS

Figlan et al., "Glass Master Coating," IBM Technical Disclosure Bulletin, Jan. 1980, p. 3651.
Ahn et al.., "Removable Protective for Photolithographic Mask," IBM Technical Disclosure Bulletin, Apr. 1972, p. 3426.
Bassous et al., "Protective Coating for Photolithographic Masks," IBM Technical Disclosure Bulletin, Mar. 1991, pp. 77-78.

* cited by examiner

*Primary Examiner* — Stephen Rosasco

(57) ABSTRACT

In one embodiment, the invention is a method and apparatus for sub-pellicle defect reduction on photomasks. One embodiment of a photomask for use in photolithography includes a substrate on which a pattern is formed, the substrate having a frontside and an opposite backside, and a protective coating formed on at least one of the frontside and the backside, the protective coating comprising silicon-based compound.

20 Claims, 2 Drawing Sheets

METHOD AND APPARATUS FOR SUB-PELLICLE DEFECT REDUCTION ON PHOTOMASKS

CROSS REFERENCE TO RELATED APPLICATIONS

This application claims the benefit of U.S. Provisional Patent Application Ser. No. 61/143,658, filed Jan. 9, 2009, which is herein incorporated by reference in its entirety.

BACKGROUND OF THE INVENTION

The present invention relates generally to semiconductor fabrication, and relates more specifically to photolithographic techniques for fabricating semiconductors.

The present invention relates generally to semiconductor fabrication, and relates more specifically to photolithographic techniques for fabricating semiconductors.

Defect growth during exposure is a growing concern in the photomask industry. Surface contaminants from the mask manufacturing process, outgassing from pellicle, adhesives, and storage containers, as well as general airborne contaminations can react during lithographic exposure and form defects on both the frontside (sub-pellicle) and backside of the mask. Sub-pellicle defect growth is a growing concern because the defects are in the focal plane of the mask and can actually print onto the semiconductor wafer. Although backside defects are not in the focal plane, they are also a concern because a large number of defects can cause a "haze" that affects the transmission of light through the mask. In addition, residual metals and other impurities on the frontside and backside of the mask may act as nucleation sites for defect growth, because these defects are often composed of heteroatoms that are very reactive with metals. It is often found that defects are formed from contaminants containing heteroatoms that are very reactive with metals and other inorganic impurities.

Conventional methods for reducing mask surface contamination include the application of fluorocarbon films that require specific tooling, or the application of aqueous solutions that prevent large crystal formation but do not prevent backside haze.

Thus, there is a need in the art for a method and apparatus for sub-pellicle defect reduction on photomasks.

SUMMARY OF THE INVENTION

In one embodiment, the invention is a method and apparatus for sub-pellicle defect reduction on photomasks. One embodiment of a photomask for use in photolithography includes a substrate on which a pattern is formed, the substrate having a frontside and an opposite backside, and a protective coating formed on at least one of the frontside and the backside, the protective coating comprising silicon-based compound.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for sub-pellicle defect reduction on photomasks. Embodiments of the invention coat a photomask with a thin film of a silicon-based compound, such as siloxane, silane, silicon oxide, silicon dioxide, silicon nitride, or silicon carbon oxyhydride, which reduces the formation of frontside sub-pellicle defects and backside mask defects on the photomask.

Figure 1:
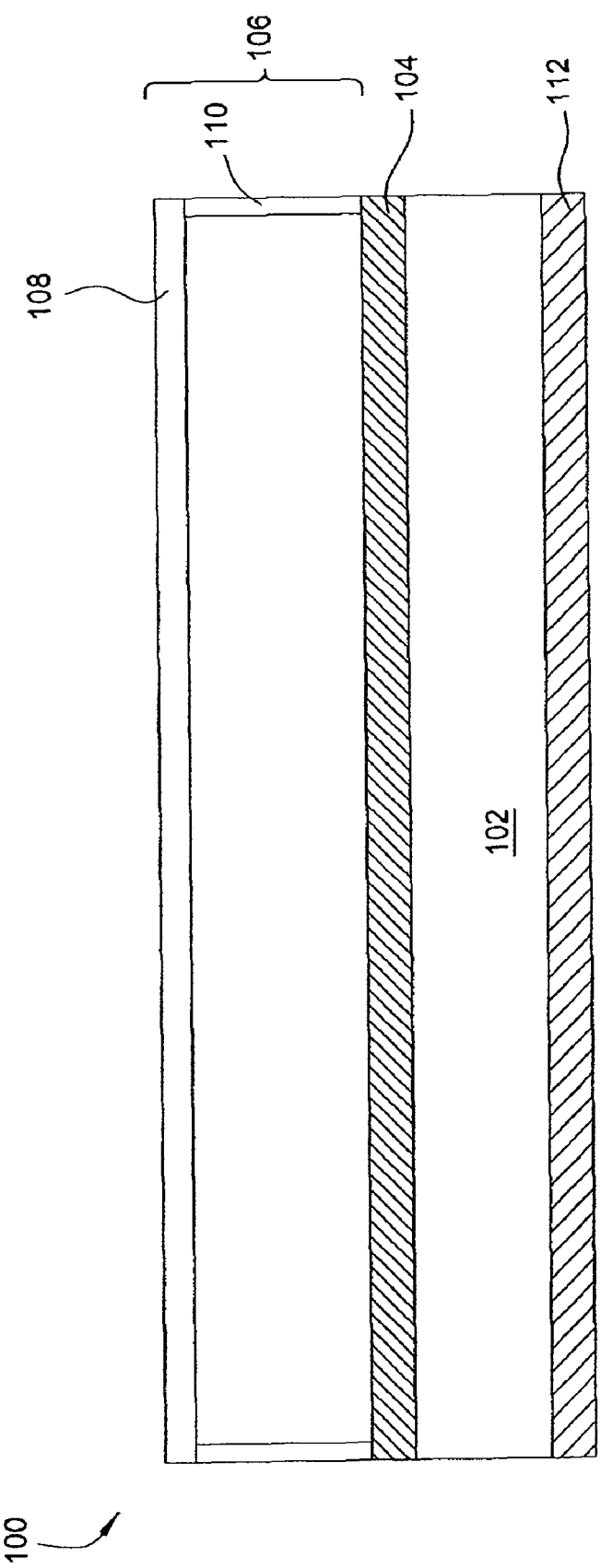
FIG. 1 is a cross sectional view illustrating one embodiment of a photomask according to the present invention.

FIG. 1 is a cross sectional view illustrating one embodiment of a photomask 100 according to the present invention. As illustrated, the photomask 100 comprises a plate or substrate 102 on which a pattern (not illustrated) is formed. A pellicle 106 is coupled to the substrate 102 for use in photolithographic processing. The pellicle 106 comprises a membrane 108 that is coupled to the substrate 102 by a frame 110, such that the membrane 108 is held a fixed distance from the surface of the substrate 102.

According to embodiments of the present invention, at least the frontside of the substrate 102 is coated with a first protective layer 104. In a further embodiment, the opposite backside of the substrate 102 is coated with a second protective layer 112. The first and second protective layers 104 and 112 are designed to minimize defect growth on the substrate 102, and are thin relative to the substrate 102 (e.g., approximately ten nanometers or less). In one embodiment, at least one of the first and second protective layers 104 and 112 comprises an optically neutral silicon-based compound, such as siloxane, silane, silicon oxide, silicon dioxide, silicon nitride, or silicon carbon oxyhydride.

The first and second protective layers 104 and 112 significantly reduce the occurrence of defects on the substrate 102 of the photomask 100. When the first and second protective layers 104 and 112 are formed of silicon oxide or silicon nitride, the first and second protective layers 104 and 112 create a diffusion barrier that effectively isolates the adsorbed contamination on the substrate surface from the corresponding airborne contaminants. The first and second protective layers 104 and 112 also cover residual metals, other foreign atoms and surface defects on the substrate 102, so that nucleation sites for airborne contamination are significantly reduced. By contrast, when the first and second protective layers 104 and 112 are formed of siloxane or silane, the first and second protective layers 104 and 112 form hydrophobic surfaces that substantially prevent the adsorption of water vapor, which has been implicated as a major factor in defect formation. This limits the surface reaction for defect growth. Thus, application of the first and second protective layers 104 and 112 effectively traps or immobilizes contaminants on the surface of the substrate 102, preventing the contaminants from turning into defects.

Experimental results have shown that thicknesses of ten nanometers or less for the first and second protective layers 104 and 112 are thin enough to create a substantially pristine surface on the substrate 102 without significantly affecting the optical characteristics of the photomask 100.

Figure 2:
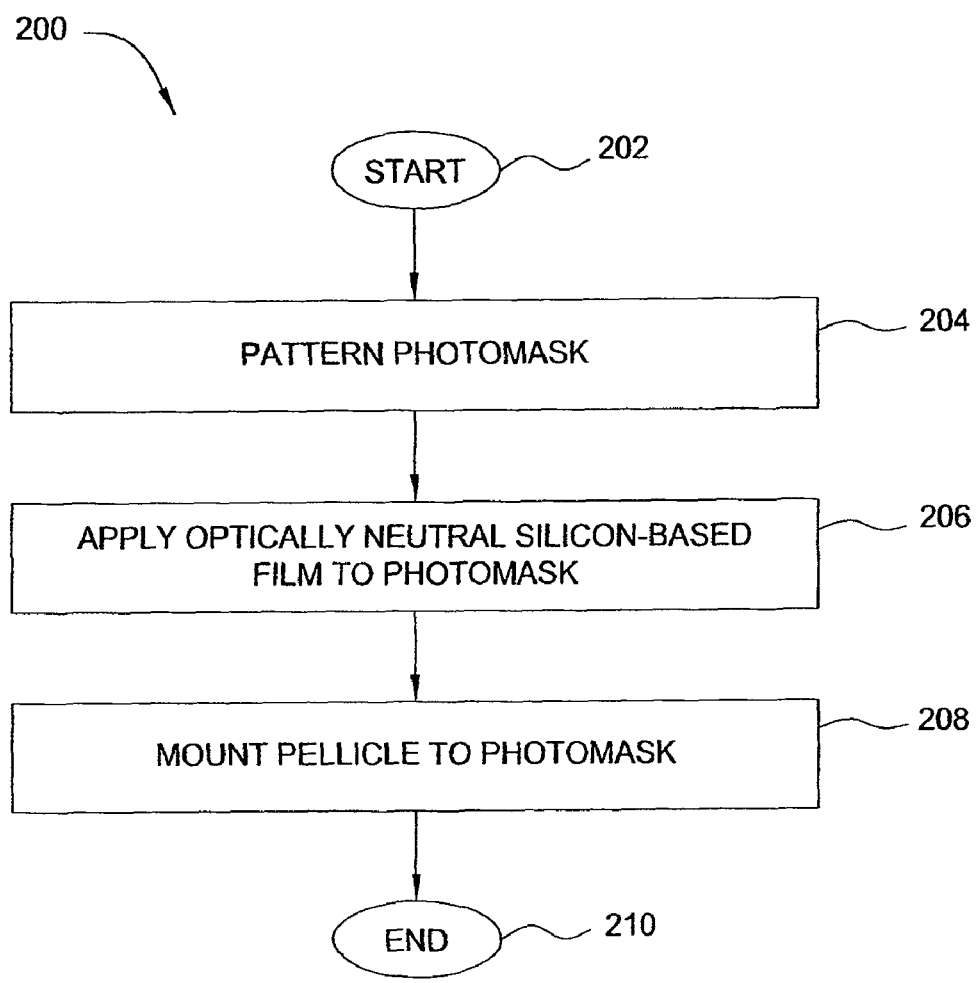
FIG. 2 is a flow diagram illustrating one embodiment of a method for forming a photomask, according to one embodiment of the present invention.

FIG. 2 is a flow diagram illustrating one embodiment of a method 200 for forming a photomask, according to one embodiment of the present invention. The method 200 may be implemented, for example, to form the photomask 100 illustrated in FIG. 1.

The method 200 is initialized at step 202 and proceeds to step 204, where the method 200 patterns a photomask. That is, the method 200 forms a mask pattern on the substrate of the photomask. The method 200 then proceeds to step 206 and applies an optically neutral silicon-based film to the photomask (e.g., such as the first and second protective layers 104 and 112 described with reference to FIG. 1). The optically neutral silicon-based film is applied to the frontside of the photomask, the backside of the photomask, or both. As described above, in one embodiment, the optically neutral silicon-based film is formed of at least one of: siloxane, silane, silicon oxide, silicon dioxide, silicon nitride, or silicon carbon oxyhydride. In one embodiment, the composition of the optically neutral silicon-based film dictates the application method used to coat the photomask.

In one embodiment, where the optically neutral silicon-based film is formed of silicon oxide or silicon dioxide, both the frontside and the backside of the photomask are coated using either sputter deposition or chemical vapor deposition (CVD). In a further embodiment, the silicon oxide or silicon dioxide coating is applied to a thickness of approximately ten nanometers or less. In an alternative embodiment, where the optically neutral silicon-based film is formed of a siloxane compound, common photomask manufacturing environment equipment, such as a Hexamethyldisilazane oven, is used to spray or dip the photomask in a dilute siloxane compound solution. In a further embodiment, the coating is cured after spraying or dipping of the photomask. In yet another embodiment, where the optically neutral silicon-based film is formed of silane, the optically neutral silicon-based film is a self-assembled layer of silane that may be applied, for example, using a gas phase or solution technique.

The method 200 mounts a pellicle to the photomask in step 208, before terminating in step 210.

A protective silicon-based film can thus be applied to one or both sides of a photomask using equipment that is common to photomask manufacturing environments (i.e., substantially no specialized equipment is necessary). As discussed above, a film applied in this manner creates a substantially pristine surface for reducing defects on the surface of a photomask without significantly affecting the optical characteristics of the photomask.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A photomask for use in photolithography, comprising:
   a substrate on which a pattern is formed, the substrate having a frontside and an opposite backside; and
   a protective coating formed on the frontside and the backside, the protective coating comprising a silicon-based compound.

2. The photomask of claim 1, wherein the protective coating is optically neutral.

3. The photomask of claim 1, wherein the protective coating has a thickness of approximately ten nanometers or less.

4. The photomask of claim 1, wherein the protective coating is formed of silicon oxide or silicon dioxide.

5. The photomask of claim 1, wherein the protective coating is formed of silicon nitride.

6. The photomask of claim 1, wherein the protective coating is formed of siloxane.

7. The photomask of claim 1, wherein the protective coating is formed of silane.

8. The photomask of claim 1, wherein the protective coating is formed of silicon carbon oxyhydride.

9. The photomask of claim 1, further comprising:
   a pellicle coupled to the substrate.

10. A method for forming a photomask for use in photolithography, the method comprising:
    patterning a substrate, the substrate having a frontside and an opposite backside; and
    applying a protective coating to the frontside and the backside, the protective coating comprising a silicon-based compound.

11. The method of claim 10, wherein the protective coating is optically neutral.

12. The method of claim 10, wherein the protective coating has a thickness of approximately ten nanometers or less.

13. The method of claim 10, wherein the protective coating is formed of silicon oxide or silicon dioxide.

14. The method of claim 13, wherein the applying comprises sputter deposition or chemical vapor deposition.

15. The method of claim 10, wherein the protective coating is formed of silicon nitride.

16. The method of claim 10, wherein the protective coating is formed of siloxane.

17. The method of claim 16, wherein the applying comprises spraying or dipping the substrate in a dilute siloxane solution.

18. The method of claim 10, wherein the protective coating is formed of silane.

19. The method of claim 18, wherein the applying comprises using a gas phase or solution technique to apply a self-assembled layer of silane.

20. A photomask for use in photolithography, comprising:
    a substrate on which a pattern is formed, the substrate having a frontside and an opposite backside; and
    a protective coating formed on at least one of the frontside and the backside, the protective coating comprising a silicon-based compound, the silicon-based compound providing a hydrophobic surface.

* * * * *